US009620521B2

(12) United States Patent
Nojima

(10) Patent No.: US 9,620,521 B2
(45) Date of Patent: Apr. 11, 2017

(54) SEMICONDUCTOR MEMORY DEVICE

(71) Applicant: Kabushiki Kaisha Toshiba, Minato-ku (JP)

(72) Inventor: Kazuhiro Nojima, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/008,992

(22) Filed: Jan. 28, 2016

(65) Prior Publication Data
US 2017/0077123 A1    Mar. 16, 2017

Related U.S. Application Data

(60) Provisional application No. 62/216,845, filed on Sep. 10, 2015.

(51) Int. Cl.
*H01L 27/115*    (2006.01)
*H01L 27/11582*    (2017.01)

(52) U.S. Cl.
CPC .............................. *H01L 27/11582* (2013.01)

(58) Field of Classification Search
None
See application file for complete search history.

(56) References Cited

U.S. PATENT DOCUMENTS

| 8,115,245 B2 | 2/2012 | Yoshimizu et al. |
| 2009/0051035 A1 | 2/2009 | Hirano et al. |
| 2015/0109844 A1* | 4/2015 | Yeh .................. H01L 27/11524 365/63 |

FOREIGN PATENT DOCUMENTS

JP    6-82819    3/1994

* cited by examiner

*Primary Examiner* — Angel Roman
*Assistant Examiner* — Kevin Quinto
(74) *Attorney, Agent, or Firm* — Oblon, McClelland, Maier & Neustadt, L.L.P.

(57) ABSTRACT

According to one embodiment, a semiconductor memory device includes a plurality of memory cells arranged on a substrate. The semiconductor memory device includes an interconnect layer including a first interconnect and a second interconnect, the first interconnect extending in a first direction, the second interconnect extending in a second direction, the first direction being tilted with respect to an arrangement direction of the memory cells, the second direction being different from the first direction and tilted with respect to the arrangement direction of the memory cells.

8 Claims, 6 Drawing Sheets

SEMICONDUCTOR MEMORY DEVICE

CROSS-REFERENCE TO RELATED APPLICATIONS

This application is based upon and claims the benefit of priority from U.S. Provisional Patent Application 62/216,845, filed on Sep. 10, 2015; the entire contents of which are incorporated herein by reference.

FIELD

Embodiments described herein relate generally to a semiconductor memory device.

BACKGROUND

A semiconductor memory device has a structure in which a memory cell array that includes multiple memory cells and a peripheral circuit that drives the memory cell array are integrated. For example, the memory cell of the semiconductor memory device includes a charge storage layer disposed between a semiconductor channel and a word line. In the case where the interconnects of these are formed using a metal or the like for the memory cells, the front surface of the wafer warps greatly due to stress such as compressive stress, tensile stress, etc., generated in the interconnects. In the case where the interconnects are arranged in multiple directions in the front surface of the wafer, it is difficult to reduce the warp of the wafer because the directions of the stress generated in the interconnects are different.

DETAILED DESCRIPTION

Figure 1:
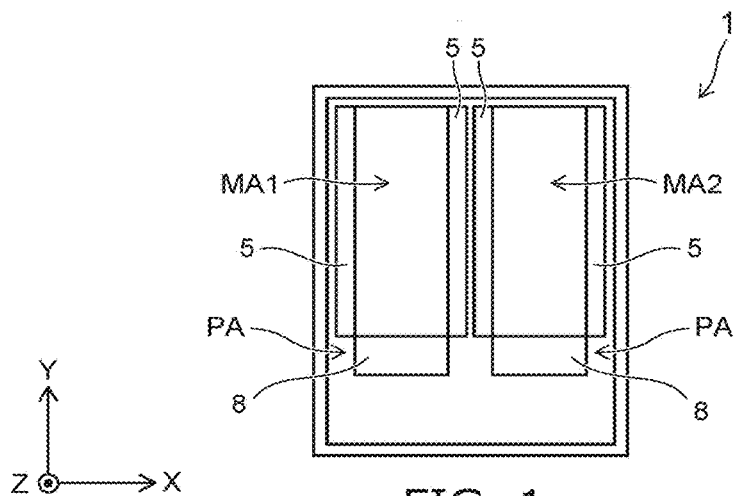
FIG. 1 is a schematic plan view showing a semiconductor memory device according to an embodiment.

According to one embodiment, a semiconductor memory device includes a plurality of memory cells arranged on a substrate. The semiconductor memory device includes an interconnect layer including a first interconnect and a second interconnect, the first interconnect extending in a first direction, the second interconnect extending in a second direction, the first direction being tilted with respect to an arrangement direction of the memory cells, the second direction being different from the first direction and tilted with respect to the arrangement direction of the memory cells.

Embodiments will now be described with reference to the drawings. The same components in the drawings are marked with the same reference numerals.

A semiconductor memory device that has a three-dimensional structure will now be described as an example.

Embodiment

FIG. 1 is a schematic plan view showing a semiconductor memory device according to an embodiment.

Figure 2:
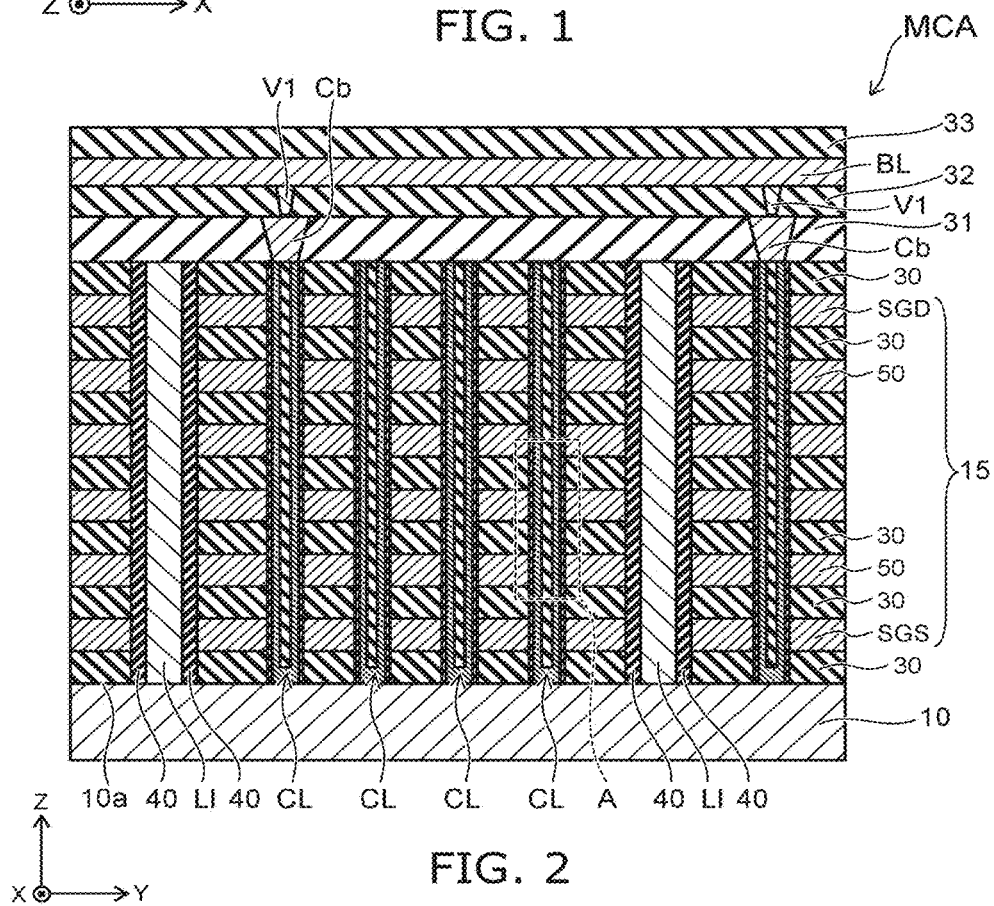
FIG. 2 is a schematic cross-sectional view showing a portion of the semiconductor memory device according to the embodiment.

FIG. 2 is a schematic cross-sectional view showing a portion of the semiconductor memory device according to the embodiment.

Figure 3:
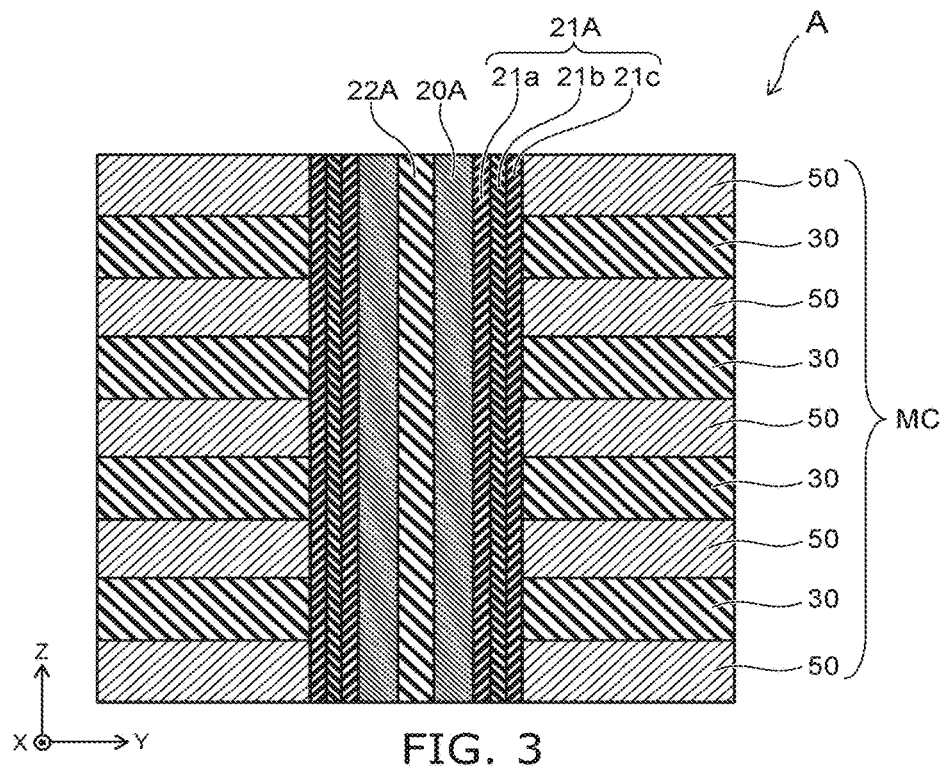
FIG. 3 is an enlarged view of region A of FIG. 2.

FIG. 3 is an enlarged view of region A of FIG. 2.

Figure 4:
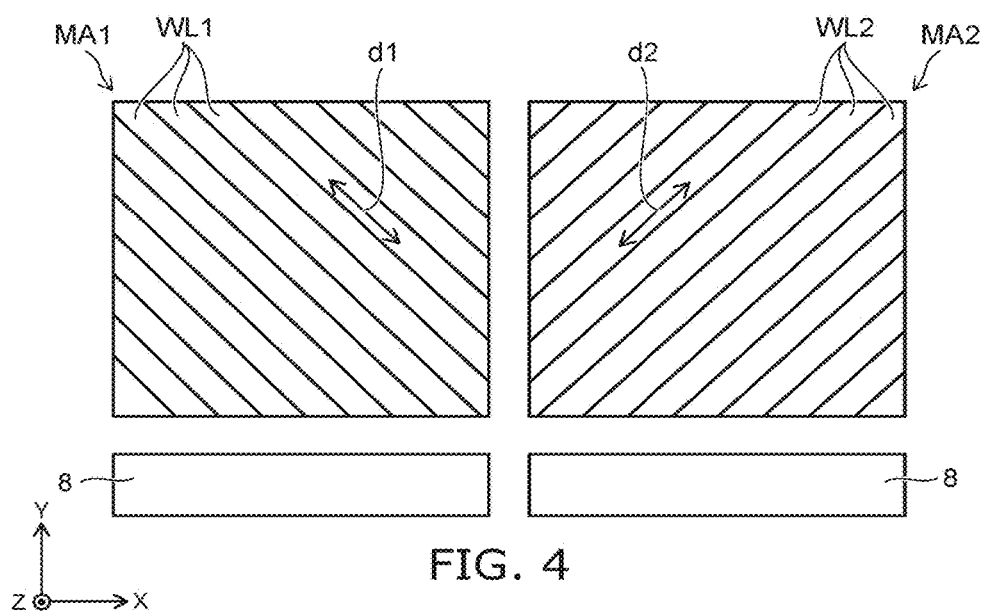
FIG. 4 is a schematic plan view showing a portion of the semiconductor memory device according to the embodiment.

FIG. 4 is a schematic plan view showing a portion of the semiconductor memory device according to the embodiment.

FIG. 1 shows a plan view of memory regions and a peripheral region of the semiconductor memory device 1. FIG. 2 and FIG. 3 show cross-sectional views of a memory cell array MCA. FIG. 4 shows an enlarged view of the memory regions of the semiconductor memory device 1.

As shown in FIG. 1, the semiconductor memory device 1 includes a memory region MA1, a memory region MA2, and a peripheral region PA. Two memory regions MA1 and MA2 are provided in the example shown in FIG. 1. For example, the memory region MA1 and the memory region MA2 are provided to be adjacent to each other. Any number of memory regions can be provided in the semiconductor memory device 1.

The peripheral region PA is provided to be adjacent to the memory regions MA1 and MA2. The peripheral region PA includes, for example, peripheral circuits such as a row decoder 5, a sense amplifier 8, etc. The row decoder 5 selects the word lines corresponding to memory cells MC and includes a word line drive circuit (not shown) that generates the potentials supplied to each of the word lines. Because the row decoder 5 is provided on two sides of the memory regions MA1 and MA2, all of the word lines inside the memory regions MA1 and MA2 can be accessed. The row decoder 5 may not be provided on the two sides of the memory regions MA1 and MA2. For example, the interconnects, etc., may be provided between the memory regions MA1 and MA2. Thereby, the number of row decoders 5 can be reduced.

The memory regions MA1 and MA2 are regions where the memory cell array MCA is provided. The peripheral region PA is a region where the peripheral circuits are provided. For example, the memory regions MA1 and MA2 and the peripheral region PA are provided in each chip; and the semiconductor memory device 1A is configured by arranging such multiple chips (referring to FIG. 9).

The memory cell array MCA will now be described.

In FIG. 2, two mutually-orthogonal directions parallel to an upper surface 10a of a substrate 10 are taken as an X-direction and a Y-direction; and a direction orthogonal to both the X-direction and the Y-direction is taken as a Z-direction. The Z-direction is the stacking direction.

As shown in FIG. 2, a stacked body 15 is provided, with an insulating layer 30 interposed, on the substrate 10. The stacked body 15 includes multiple electrode layers 50 (interconnect layers), multiple insulating layers 30, a source-side selection gate SGS, and a drain-side selection gate SGD. The multiple electrode layers 50 are stacked to be separated from each other; and the multiple insulating layers 30 are provided between the multiple electrode layers 50. For example, the multiple electrode layers 50 and the multiple insulating layers 30 are stacked alternately one layer at a time. The number of layers of electrode layers 50 shown in the drawing is an example; and the number of layers of electrode layers 50 is arbitrary.

The source-side selection gate SGS is provided in the lowermost layer of the stacked body 15. The drain-side selection gate SGD is provided in the uppermost layer of the stacked body 15. The insulating layer 30 is provided on the stacked body 15.

For example, the multiple electrode layers 50 are made of one of a metal, a metal silicide, or polysilicon. The source-side selection gate SGS and the drain-side selection gate SGD may include the same material as the multiple electrode layers 50 described above or may include different materials. The insulating layers 30, an insulating layer 31, an insulating layer 32, and an insulating layer 33 include, for example, insulating layers including silicon oxide.

A columnar unit CL that extends in the Z-direction is provided inside the stacked body 15. For example, the columnar unit CL is provided in a circular columnar or elliptical columnar configuration. The columnar unit CL extends in the Z-direction and is buried in the insulating layers 30 and the electrode layers 50 included in the memory cells MC.

As shown in FIG. 3, the columnar unit CL includes a channel body 20A (a semiconductor unit), a memory film 21A, and a core insulating unit 22A. The channel body 20A is, for example, a silicon film.

The memory film 21A is provided between the stacked body 15 and the channel body 20A. A tunneling insulating layer 21a, a charge storage layer 21b, and a blocking insulating layer 21c are stacked in the memory film 21A in order from the channel body 20A side. Although the tunneling insulating layer 21a normally is insulative, the tunneling insulating layer 21a is a layer in which a tunneling current flows when a prescribed voltage within the range of the drive voltage of the semiconductor memory device 1 is supplied. The charge storage layer 21b is a layer that stores charge and includes, for example, a layer including silicon nitride. The blocking insulating layer 21c is a layer in which a current substantially does not flow even when a voltage within the range of the drive voltage of the semiconductor memory device 1 is supplied and is an oxide layer formed of a high dielectric constant material, e.g., silicon oxide, aluminum oxide, or hafnium oxide or a multilayer film in which these oxide layers are stacked.

The core insulating unit 22A is provided on the inner side of the channel body 20A. The core insulating unit 22A includes, for example, a silicon oxide film and may include an air gap. The core insulating unit 22A may not be provided on the inner side of the channel body 20A.

An interconnect unit LI that extends in the Z-direction through the stacked body 15 is provided in the stacked body 15. The interconnect unit LI is electrically connected via a contact to a source line (not shown) on the interconnect unit LI. For example, the interconnect unit LI is formed of a metal material such as tungsten, etc. The interconnect unit LI includes a plate-shaped portion. For example, the interconnect unit LI may include multiple plate-shaped portions connected to each other.

An insulating film 40 is provided on the side wall of the interconnect unit LI. Similarly to the interconnect unit LI, the insulating film 40 extends in the Z-direction. For example, a film that includes silicon oxide is used as the insulating film 40. The interconnect unit LI is electrically connected to the columnar unit CL at the lower surface of the interconnect unit LI.

A contact unit Cb is provided at the upper end of the channel body 20A. Also, a contact unit V1 is provided on the contact unit Cb. The contact unit V1 is finer than the contact unit Cb. The contact unit Cb and the contact unit V1 are, for example, contact plugs and are formed by stacking metal-containing layers such as a tungsten layer, a titanium nitride layer, etc.

Multiple bit lines BL are provided on the contact unit V1. The multiple bit lines BL are separated from each other in the X-direction and extend in the Y-direction. For example, the multiple bit lines BL are formed of a metal film. The upper end of the channel body 20A is connected to the bit line BL via the contact unit Cb and the contact unit V1. One of the multiple columnar units CL (the channel bodies 20A) selected from each of regions separated from each other in the Y-direction is connected to one common bit line BL.

A drain-side selection transistor is formed at the upper end of the columnar unit CL; and a source-side selection transistor is formed at the lower end of the columnar unit CL. The memory cells MC, the drain-side selection transistor, and the source-side selection transistor are vertical transistors in which a current flows in the stacking direction of the stacked body 15 (the Z-direction).

The selection gates SGD and SGS described above function as gate electrodes (control gates) of the selection transistors. The memory film 21A that functions as the gate insulator films of the selection transistors is provided between the channel body 20A and each of the selection gates SGD and SGS.

The multiple memory cells MC that have the electrode layers 50 of each layer as control gates are provided between the drain-side selection transistor and the source-side selection transistor.

The multiple memory cells MC, the drain-side selection transistor, and the source-side selection transistor are connected in series via the channel body 20A and are included in one memory string. The multiple memory cells MC are provided three-dimensionally in the X-direction, the Y-direction, and the Z-direction by arranging the memory strings in a planar direction parallel to the X-Y plane.

The semiconductor memory device 1 of the embodiment can freely and electrically erase/program data and can retain the memory content even when the power supply is OFF.

The configuration of the electrode layer 50 will now be described.

As shown in FIG. 4, multiple word lines WL1 are provided in the memory region MA1 in which the memory cell array MCA is provided. Multiple word lines WL2 are provided in the memory region MA2 in which the memory cell array MCA is provided. The word lines WL1 and the word lines WL2 are electrically connected to the row decoder 5 provided on the two sides of the memory regions MA1 and MA2.

In each of the electrode layers 50 of the memory cell array MCA, multiple blocks are arranged in the X-Y plane and form portions of the interconnect pattern. Also, each block corresponds to a portion between the mutually-adjacent interconnect units LI; and word lines are formed as the control gates. For example, in each block, two columns of columnar units made of the multiple columnar units CL arranged in a prescribed direction are arranged. Each of the bit lines BL extends in the Y-direction over multiple blocks and is connected to one columnar unit CL of each block. For example, each block may include four sub-blocks. In such a case, each sub-block can be configured so that the columnar units CL are arranged and the bit line BL is connected to the columnar unit CL.

The word lines WL1 of the memory region MA1 extend in a first direction d1 that is tilted with respect to the direction in which the memory regions MA1 and MA2 are arranged. The word lines WL2 of the memory region MA2 extend in a second direction d2 that is tilted with respect to the direction in which the memory regions MA1 and MA2 are arranged.

The direction in which the memory regions MA1 and MA2 are arranged is, for example, the direction in which the memory cell arrays MCA are arranged. In the example shown in FIG. 4, the direction in which the memory regions MA1 and MA2 are arranged is the X-direction.

The first direction d1 and the second direction d2 are directions that are parallel to the upper surface 10a of the substrate 10 and are directions that are orthogonal to the Z-direction which is the stacking direction.

The first direction d1 and the second direction d2 are mutually-different directions. For example, the first direction d1 and the second direction d2 are orthogonal. In the case where the first direction d1 and the second direction d2 are orthogonal, the angle formed by the first direction d1 and the X-direction is 45 degrees. Also, the angle formed by the second direction d2 and the X-direction is 45 degrees. For example, the first direction and the second direction are directions that are symmetric with the Y-direction as the center.

Interconnect patterns P1 and P2 are formed in the memory regions MA1 and MA2 by such an arrangement of the word lines WL1 and WL2.

The interconnect patterns P1 and P2 will now be described.

Figure 5A:
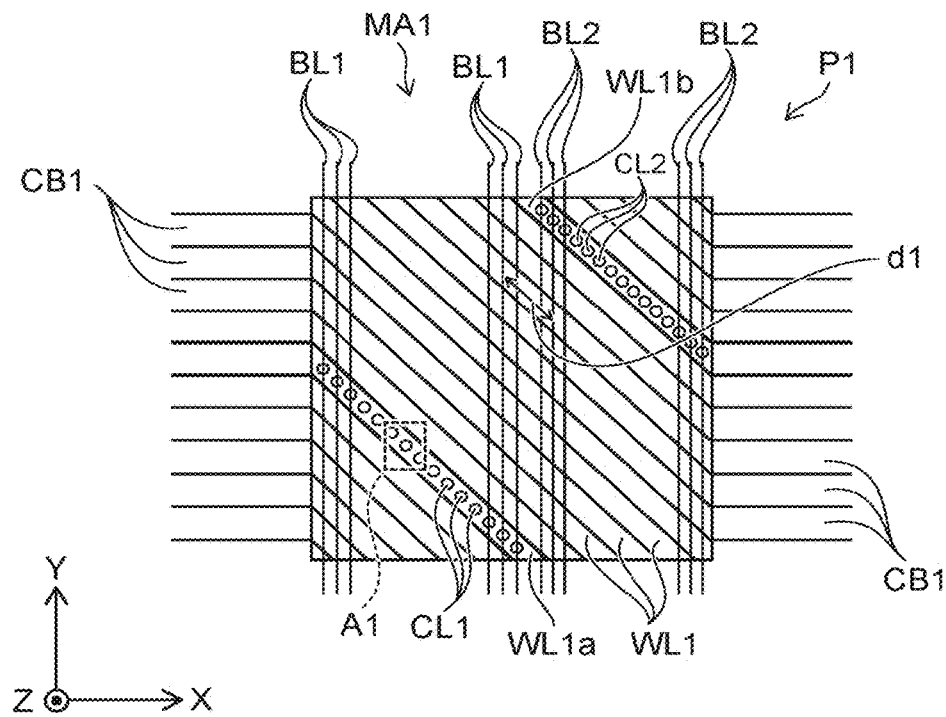
FIG. 5A and FIG. 5B are schematic plan views showing the interconnect pattern.
Figure 5B:
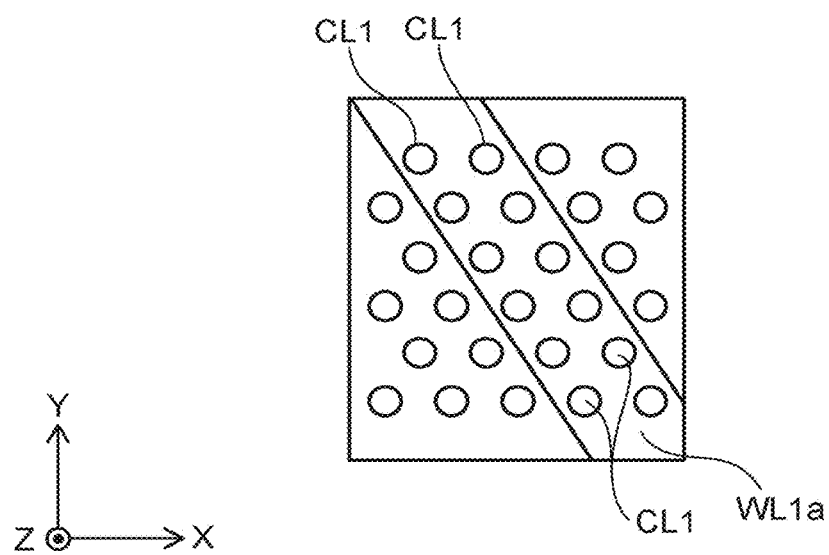

FIG. 5A and FIG. 5B are schematic plan views showing the interconnect pattern.

Figure 6A:
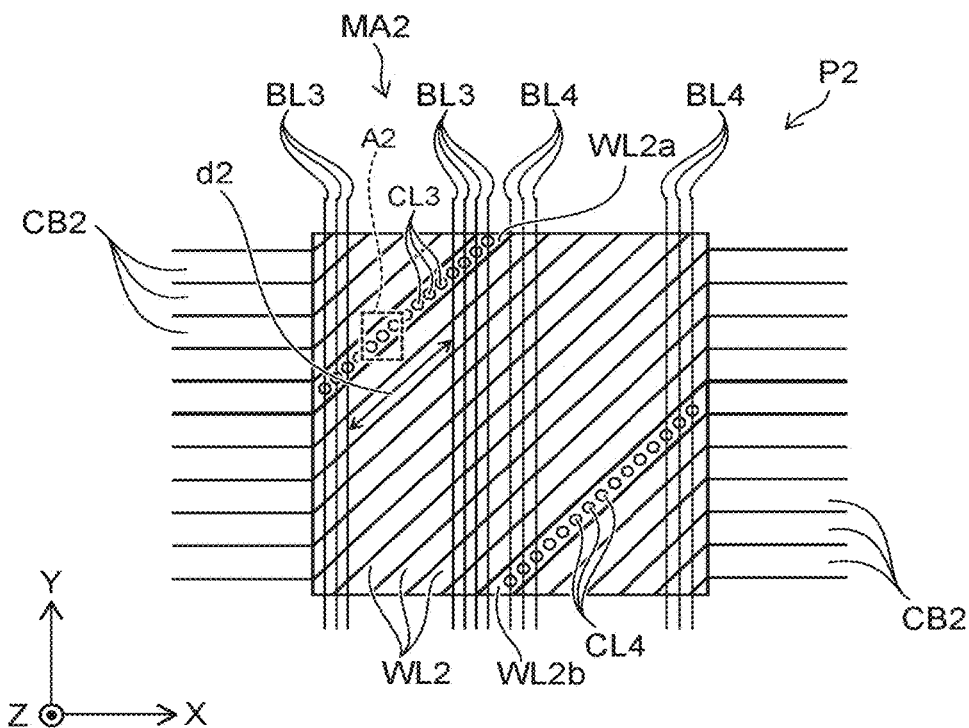
FIG. 6A and FIG. 6B are schematic plan views showing the interconnect pattern.
Figure 6B:
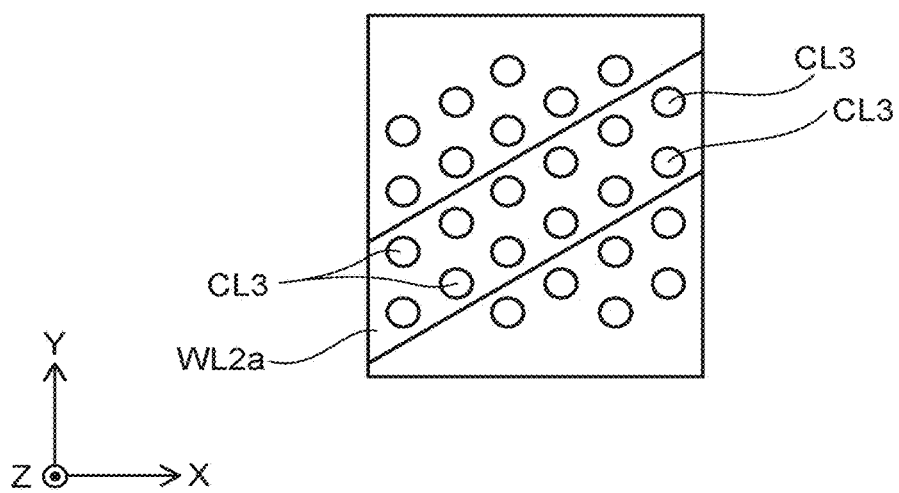

FIG. 6A and FIG. 6B are schematic plan views showing the interconnect pattern.

FIG. 5A shows the interconnect pattern P1 that is formed in the memory region MA1. FIG. 5B is an enlarged view of the portion of FIG. 5A enclosed with dotted line A1 and shows the arrangement of columnar units CL1. FIG. 6A shows the interconnect pattern P2 that is formed in the memory region MA2. FIG. 6B is an enlarged view of the portion of FIG. 6A enclosed with dotted line A2 and shows the arrangement of columnar units CL3.

As shown in FIG. 5A, the multiple word lines WL1 that extend along the first direction d1 are provided in the memory region MA1. The multiple word lines WL1 are connected to connection units CB1. The connection units CB1 are electrically connected to the row decoder 5 and are provided on two sides of the memory region MA1 so that all of the word lines WL1 of the memory region MA1 can be accessed.

For example, a word line WL1a is formed so that the multiple columnar units CL1 are arranged along the first direction d1 and pierce in the Z-direction. The multiple columnar units CL1 are connected to bit lines BL1 extending in the Y-direction. Also, a word line WL1b is formed so that the multiple columnar units CL2 are arranged along the first direction d1 and pierce in the Z-direction. The multiple columnar units CL2 are connected to bit lines BL2 extending in the Y-direction. The bit lines BL1 and BL2 extend in the Y-direction over the multiple word lines WL1 and are connected to one columnar unit CL of each word line WL1.

As shown in FIG. 5B, the multiple columnar units CL1 are arranged in two columns along the first direction d1. For example, the number of columnar units CL arranged per unit surface area of the word line WL1 can be the same for the case where the word line WL1 extends along the first direction d1 and for the case where the word line WL1 extends in a direction (the X-direction) perpendicular to the direction in which the bit lines BL extend. In the example shown in FIG. 5B, the number of the columnar units CL1 arranged in a surface area S1 of the word line WL1a is 12. In the case where the word line WL1a extends in the X-direction, the columnar units CL1 are arranged in four columns in the surface area S1 of the word line WL1a; and the number of the columnar units CL1 is 12. The columnar units CL may be arranged in three or more columns along the first direction d1 in each word line WL1.

The word lines WL1 extend along the first direction d1 in the memory region MA1. The multiple columnar units CL are arranged along the first direction d1. Also, the word lines WL1 are not provided to be perpendicular to the direction (the Y-direction) in which the bit lines BL extend.

As shown in FIG. 6A, the multiple word lines WL2 that extend along the second direction d2 are provided in the memory region MA2. The multiple word lines WL2 are connected to connection units CB2. The connection units CB2 are electrically connected to the row decoder 5 and are provided on two sides of the memory region MA2 so that all of the word lines WL2 of the memory region MA2 can be accessed.

For example, a word line WL2a is formed so that the multiple columnar units CL3 are arranged along the second direction d2 and pierce in the Z-direction. The multiple columnar units CL3 are connected to bit lines BL3 extending in the Y-direction. Also, a word line WL2b is formed so that multiple columnar units CL4 are arranged along the second direction d2 and pierce in the Z-direction. The multiple columnar units CL4 are connected to bit lines BL4 extending in the Y-direction. The bit lines BL3 and BL4 extend in the Y-direction over the multiple word lines WL2 and are connected to one columnar unit CL of each word line WL2.

As shown in FIG. 6B, the multiple columnar units CL3 are arranged in two columns along the second direction d2. For example, the number of columnar units CL arranged per unit surface area of the word line WL2 can be the same for the case where the word line WL2 extends along the second direction d2 and for the case where the word line WL2 extends in a direction (the X-direction) perpendicular to the direction in which the bit lines BL extend. In the example shown in FIG. 6B, the number of the columnar units CL3 arranged in a surface area S2 of the word line WL2a is 12. In the case where the word line WL2a extends in the X-direction, the columnar units CL3 are arranged in the four columns in the surface area S2 of the word line WL2a; and the number of columnar units CL3 is 12. The columnar units CL may be arranged in three or more columns along the second direction d2 in each word line WL2.

The word lines WL2 extend along the second direction d2 in the memory region MA2. The multiple columnar units CL are arranged along the second direction d2. Also, the word lines WL2 are not provided to be perpendicular to the direction (the Y-direction) in which the bit lines BL extend.

The sizes of the memory regions MA1 and MA2 will now be described.

Figures 7A, 7B:
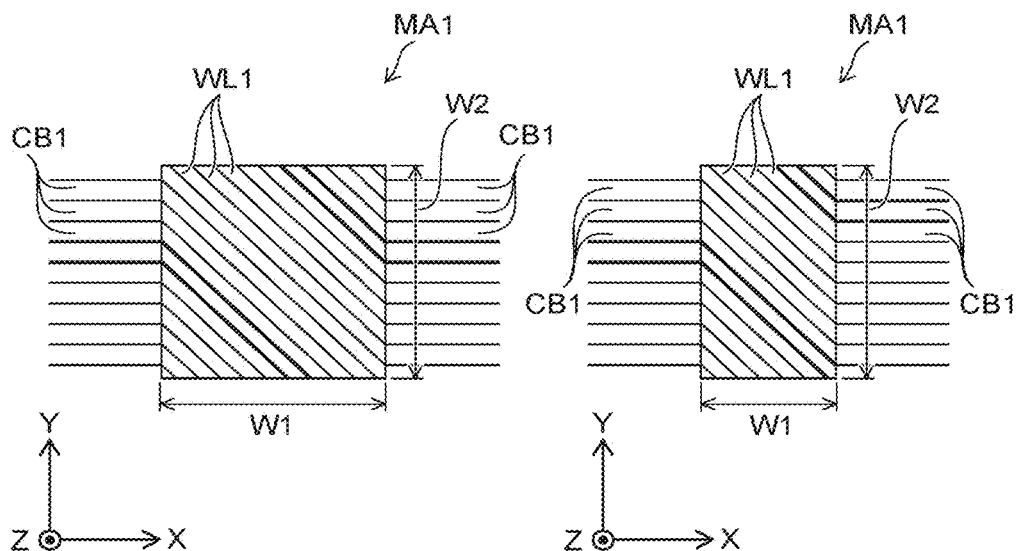
FIG. 7A and FIG. 7B are schematic plan views showing sizes of the memory regions.

FIG. 7A and FIG. 7B are schematic plan views showing sizes of the memory regions.

Figures 8A, 8B:
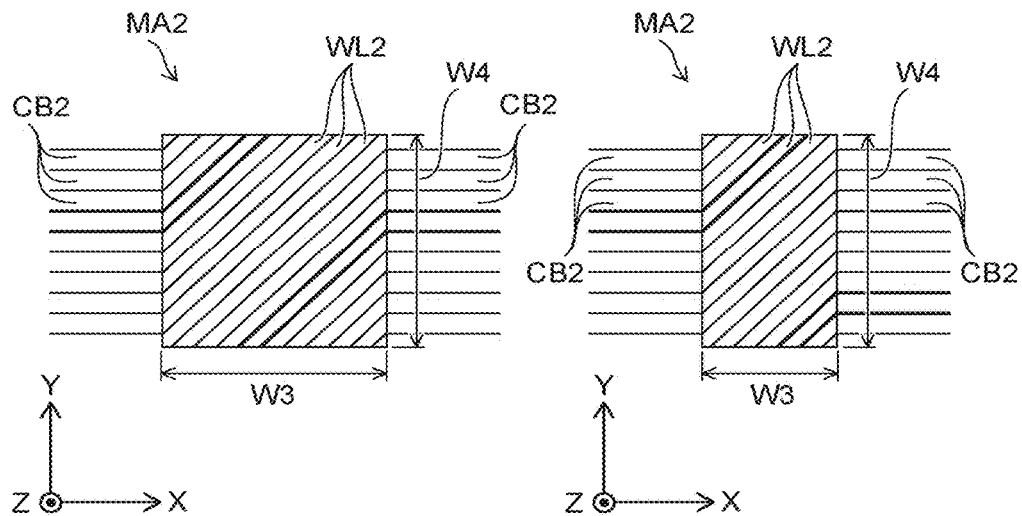
FIG. 8A and FIG. 8B are schematic plan views showing sizes of the memory regions.

FIG. 8A and FIG. 8B are schematic plan views showing sizes of the memory regions.

FIG. 7A and FIG. 7B show sizes of the memory region MA1. FIG. 8A and FIG. 8B show sizes of the memory region MA2.

As shown in FIG. 7A and FIG. 7B, all of the word lines WL1 can be connected to the connection units CB1 in the case where W1 and W2 are equal (FIG. 7A) or in the case where W2 is larger than W1 (FIG. 7B), where the widths of the memory region MA1 in the X-direction and the Y-direction are W1 and W2. For example, in the X-Y plane, the memory region MA1 has a square configuration such as that shown in FIG. 7A or a rectangular configuration such as that shown in FIG. 7B. Thereby, the memory region MA1 can be formed so that all of the word lines WL1 can be accessed.

As shown in FIG. 8A and FIG. 8B, all of the word lines WL2 can be connected to the connection units CB2 in the case where W3 and W4 are equal (FIG. 8A) or in the case where W4 is larger than W3 (FIG. 8B), where the widths of the memory region MA2 in the X-direction and the Y-direction are W3 and W4. For example, in the X-Y plane, the memory region MA2 has a square configuration such as that shown in FIG. 8A or a rectangular configuration such as that shown in FIG. 8B. Thereby, the memory region MA2 can be formed so that all of the word lines WL2 can be accessed.

The stress that is generated in the substrate will now be described.

Figure 9:
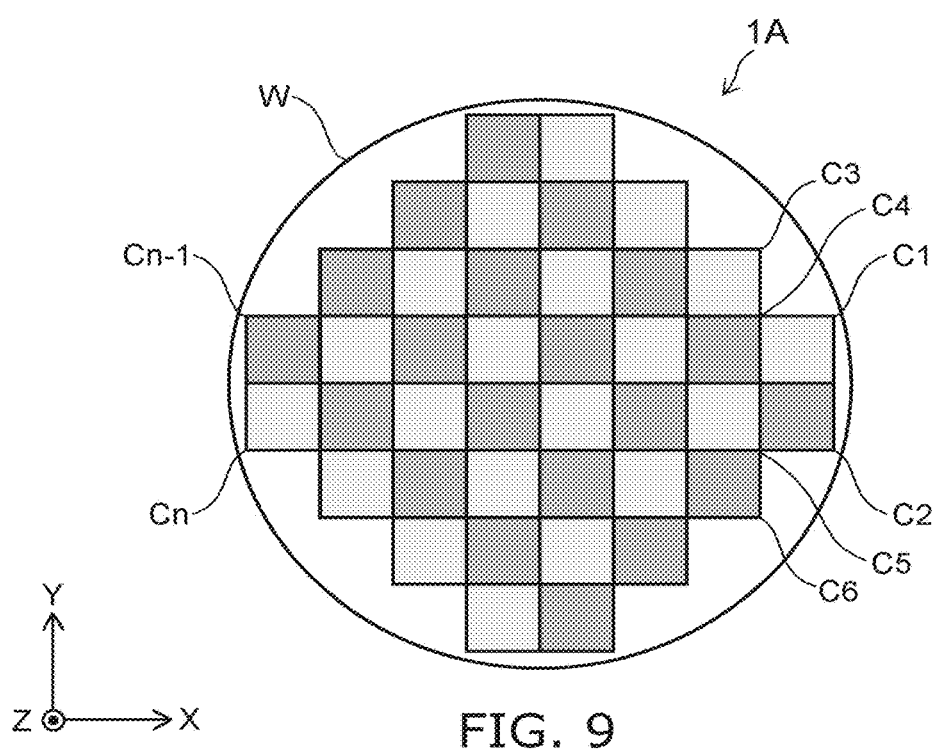
FIG. 9 is a figure showing an arrangement of chips.

FIG. 9 is a figure showing an arrangement of chips.

As shown in FIG. 9, multiple chips C (chips C1 to Cn) are arranged on a wafer W and included in the semiconductor memory device 1A. Also, singulation into multiple semiconductor memory devices can be performed by dicing the wafer W and the structure bodies formed on the wafer W. For example, in the case where the two mutually-adjacent memory regions MA1 and MA2 are provided in each chip C1 to Cn, the word lines WL1 of the memory region MA1 extend along the first direction d1 that is tilted with respect to the direction in which the memory regions MA1 and MA2 are arranged. Also, the word lines WL2 of the memory region MA2 extend along the second direction d2 that is different from the first direction d1 and tilted with respect to the direction in which the memory regions MA1 and MA2 are arranged.

For example, in the case where the memory regions MA1 and MA2 are arranged so that the word lines WL1 and WL2 extend along the same direction (e.g., the X-direction in which the memory regions MA1 and MA2 are arranged) in each chip C1 to Cn, stress such as compressive stress, tensile stress, etc., is generated in one surface of the substrate 10; the distortion of the substrate 10 increases; and the substrate 10 warps greatly. Also, in a semiconductor memory device that has a three-dimensional structure, the stress accumulates more easily in one direction as the number of electrode layers 50 increases. Thereby, the warp of the substrate 10 becomes large. Such a large warp causes the precision of the manufacturing processes to degrade, impedes stable operations of the manufacturing apparatuses, and causes warp and breaking of the wafer.

There are cases where the warp of the wafer can be reduced by forming a counter film on the back surface of the wafer. However, in the case where the warp that is in the same direction as the direction of the word lines and the warp that is in a direction orthogonal to the direction of the word lines are greatly different, it is difficult to reduce the warp of the wafer by the counter film provided on the back surface of the wafer.

On the other hand, the word lines WL1 of the memory region MA1 extend along the first direction d1; and the word lines WL2 of the memory region MA2 extend along the second direction d2 that is different from the first direction d1. By forming such memory regions MA1 and MA2 in each chip C1 to Cn, the stress such as compressive stress, tensile stress, etc., that is generated in the electrode layer 50 is reduced. That is, the stress that is generated in the memory region MA1 and the stress that is generated in the memory region MA2 cancel each other in each chip C1 to Cn. Thereby, the warp of the substrate 10 decreases; and the warp of the wafer can be reduced.

Also, by providing the memory regions so that the directions in which each of the word lines extend are mutually-different, the wafer can be formed so that the directions in which the wafer warps are different. That is, the bias of the direction of the warp of the wafer in one direction can be suppressed. Thereby, the warp of the wafer can be reduced.

In the case where four memory regions are provided inside each chip C1 to Cn, the memory regions may be provided so that the directions in which each of the word lines extend are mutually-different. That is, in the case where M (M being an integer not less than 2) memory regions are provided inside each chip C1 to Cn, M memory regions can be provided so that the directions in which the word lines extend are mutually-different. That is, in each chip C1 to Cn, the directions in which the word lines extend are different from each other to cancel the stress generated in the M memory regions.

In the case where one memory region is provided inside each chip C1 to Cn, the memory regions may be provided so that the directions in which the two word lines extend are mutually-different between the memory regions provided every adjacent chip (e.g., the memory region provided in the chip C1 and the memory region provided in the chip C2).

The arrangements of the memory regions inside the chips illustrated in the embodiment are not limited to a semiconductor memory device having a three-dimensional structure and are applicable also to a semiconductor memory device having a two-dimensional structure. Further, the interconnect pattern illustrated in the embodiment is applicable also to other semiconductor devices.

A method for manufacturing the semiconductor memory device according to the embodiment will now be described.

A method for forming the interconnect pattern of the memory cell array MCA in the semiconductor memory device 1 having the three-dimensional structure will be described.

Initially, a stacked body in which the insulating layers 30 and sacrificial layers are stacked alternately on the substrate 10 is formed; and subsequently, multiple memory holes that pierce the stacked body and reach the substrate 10 are made. For example, the multiple memory holes are made by RIE (Reactive Ion Etching). Continuing, the memory film 21A, the channel body 20A, and the core insulating unit 22A are formed in order inside the memory holes. Thereby, the columnar units CL are formed. On the other hand, a slit is made in the stacked body. The slit extends in the first direction d1 and the second direction d2.

Then, after removing the sacrificial layers via the slit, conductive layers are formed inside the cavities where the sacrificial layers were removed. Thereby, the stacked body 15 that includes the multiple electrode layers 50, the multiple insulating layers 30, the source-side selection gate SGS, and the drain-side selection gate SGD is formed. The electrode layers 50 are divided for each column of the columnar units CL arranged along the first direction d1. The electrode layers 50 are divided for each column of the columnar units CL arranged along the second direction d2. That is, the electrode layers 50 are divided so that the multiple word lines WL1 and WL2 that extend along the first direction d1 and the second direction d2 are formed. Continuing, an insulating material, etc., are filled into the slit.

Then, the contact units Cb and V1 are formed on the columnar units CL; and subsequently, the bit lines BL are formed. The first direction d1 and the second direction d2 are not provided to be perpendicular to the direction in which the bit lines BL extend.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
   a substrate;
   a plurality of memory cells, each of the plurality of memory cells including an insulating layer and an electrode layer stacked alternately on the substrate;
   a semiconductor unit provided on the substrate, the semiconductor unit extending in a stacking direction; and
   a charge storage layer provided between the semiconductor unit and the electrode layer,
   the electrode layer including a first interconnect and a second interconnect, the first interconnect extending in a first direction, the second interconnect extending in a second direction, the first direction being orthogonal to the stacking direction and tilted with respect to an arrangement direction of the memory cells, the second direction being orthogonal to the stacking direction, being tilted with respect to the arrangement direction of the memory cells, and being different from the first direction.

2. The semiconductor memory device according to claim 1, wherein the first direction and the second direction intersect substantially perpendicularly.

3. The semiconductor memory device according to claim 1, further comprising a third interconnect connected to the semiconductor unit, the third interconnect not being provided perpendicular to the first interconnect and the second interconnect.

4. The semiconductor memory device according to claim 3, wherein the first interconnect and the second interconnect are arranged symmetrically with an extension direction of the third interconnect as a center.

5. The semiconductor memory device according to claim 3, wherein
   the first interconnect and the second interconnect are word lines, and
   the third interconnect is a bit line.

6. The semiconductor memory device according to claim 1, wherein
   the first interconnect is provided in a first memory region, the plurality of memory cells being provided in the first memory region, and
   the second interconnect is provided in a second memory region adjacent to the first memory region, the plurality of memory cells being provided in the second memory region.

7. The semiconductor memory device according to claim 6, wherein the first direction and the second direction are tilted with respect to an arrangement direction of the first memory region and the second memory region.

8. The semiconductor memory device according to claim 1, further comprising a plurality of columnar units, the semiconductor unit and the charge storage layer being provided in each of the plurality of columnar units,
   the plurality of columnar units being arranged along the first direction and the second direction.

* * * * *